United States Patent
Maunumäki et al.

(10) Patent No.: US 11,920,988 B2
(45) Date of Patent: Mar. 5, 2024

(54) IMPROVING, DETECTING AND INDICATING STABILITY IN AN INDUSTRIAL TEMPERATURE DRY BLOCK CALIBRATOR

(71) Applicant: Beamex Oy Ab, Pietarsaari (FI)

(72) Inventors: Taija Maunumäki, Kokkola (FI); Mats Byggmästar, Pietarsaari (FI)

(73) Assignee: Beamex Oy Ab, Pietarsaari (FI)

( * ) Notice: Subject to any disclaimer, the term of this patent is extended or adjusted under 35 U.S.C. 154(b) by 427 days.

(21) Appl. No.: 17/080,522

(22) Filed: Oct. 26, 2020

(65) Prior Publication Data
US 2021/0123822 A1  Apr. 29, 2021

(30) Foreign Application Priority Data
Oct. 28, 2019  (FI) ..................................... 20195922

(51) Int. Cl.
*G01K 15/00*    (2006.01)
*G01R 22/06*    (2006.01)
*G05D 23/19*    (2006.01)

(52) U.S. Cl.
CPC ......... *G01K 15/005* (2013.01); *G01R 22/061* (2013.01); *G05D 23/1919* (2013.01)

(58) Field of Classification Search
CPC . G01K 15/005; G01R 22/061; G05D 23/1919
USPC ......................................................... 702/99
See application file for complete search history.

(56) References Cited

U.S. PATENT DOCUMENTS

| | | |
|---|---|---|
| 3,686,460 A | 8/1972 | Lamparter |
| 8,483,986 B2 * | 7/2013 | Riho .................... G11C 7/1084 702/65 |
| 9,341,131 B2 * | 5/2016 | Weber ................. F02D 41/2454 |

(Continued)

FOREIGN PATENT DOCUMENTS

| | | |
|---|---|---|
| CN | 202014241 U | * 10/2011 |
| CN | 106205269 | 12/2016 |

(Continued)

OTHER PUBLICATIONS

Search Report for Finnish Application No. 20195922 dated May 18, 2020.

(Continued)

*Primary Examiner* — Gail Kaplan Verbitsky
(74) *Attorney, Agent, or Firm* — Thomas | Horstemeyer, LLP (57) ABSTRACT

The present invention discloses methods for detecting and improving temperature stability in measurements performed by a dry block, i.e. a temperature calibrator. The dry block comprises a heating and cooling device. An energy metering integrated circuit measures an applied input power to the heating elements of the heating and cooling device. Additionally, a real-time compensation algorithm uses measurement results obtained by the energy metering integrated circuit, and outputs a control signal to the heating elements. The arrangement may comprise a back draft damper adjacent to a fan. The fan position may be selected. Stability criteria may be set. Leaning of the dry block can be tracked. Different sensors are used for the temperature control and for the temperature stability indication.

13 Claims, 4 Drawing Sheets

(56) References Cited

U.S. PATENT DOCUMENTS

| | | | |
|---|---|---|---|
| 2003/0151415 A1* | 8/2003 | Randall | G01R 35/04 |
| | | | 324/601 |
| 2007/0289314 A1* | 12/2007 | Liebmann | F25B 21/04 |
| | | | 374/1 |
| 2007/0291815 A1* | 12/2007 | Walker | G01K 15/005 |
| | | | 374/1 |
| 2012/0149971 A1* | 6/2012 | Jeevanandam | A61M 60/554 |
| | | | 600/17 |
| 2015/0323806 A1* | 11/2015 | Arroyo | A61B 5/6831 |
| | | | 73/514.01 |
| 2015/0338289 A1 | 11/2015 | Friedrichs | |
| 2019/0094329 A1 | 3/2019 | Minich | |
| 2021/0010876 A1* | 1/2021 | Zhao | G01K 15/005 |

FOREIGN PATENT DOCUMENTS

| | | | | |
|---|---|---|---|---|
| CN | 110017913 A | * | 7/2019 | |
| CN | 110017915 | | 7/2019 | |
| CN | 210803703 U | * | 6/2020 | |
| DE | 102008034361 A1 | * | 5/2009 | ........... G01K 15/002 |
| EP | 2947439 A1 | * | 11/2015 | ........... G01K 15/002 |
| WO | WO-2019137343 A1 | * | 7/2019 | ........... G01K 15/002 |
| WO | WO-2019179229 A1 | * | 9/2019 | ......... F27D 21/0014 |

OTHER PUBLICATIONS

European Search Report for Application No. 20203751.1 dated Apr. 13, 2021.

* cited by examiner

IMPROVING, DETECTING AND INDICATING STABILITY IN AN INDUSTRIAL TEMPERATURE DRY BLOCK CALIBRATOR

CROSS-REFERENCE TO RELATED APPLICATION

This application claims benefit of and priority to Finnish Application No. 20195922, filed, Oct. 28, 2019. The entire content of which is incorporated herein by reference.

TECHNICAL FIELD

The present invention relates to temperature calibrations, and such procedures applied in temperature calibrators, widely used in various industrial processes and plants, for instance.

BACKGROUND

Stability is extremely important in temperature calibrations. If the temperature does not remain stable, accurate calibration is not possible in the first place. For automatic calibrations, the calibrator needs a system to detect, when the temperature is stable enough to start the calibration. The calibrator also requires some method or means to indicate to the user, when sufficient stability has been reached.

Dry blocks i.e. dry block calibrators are versatile i.e. multi-use temperature calibrators that work by heating and in some cases by cooling a metal block to a specific temperature and by maintaining that temperature. Many dry blocks utilize one or more interchangeable inserts into which holes are drilled. These holes accommodate a range of temperature sensors to be calibrated. The size of the holes correspond to the diameter of the temperature sensors under test. Good heat transfer between an insert and a sensor is critical for accurate calibrations when using a dry block temperature calibrator. Dry blocks can in principle be designed both as portable devices or as benchtop configurations. The measured temperatures may vary in a range which may locate between −25 and +660° C. (over the complete range, or partially over a sub-range depending on an application area).

In a high-temperature dry block, resistive heaters are typically used to heat the calibrator block and a fan is used cool down the calibrator block. Both of these are mandatory for the correct functionality of a dry block, but they act also as sources of instability. The heating elements are powered by mains voltage, which is not always stable, especially in an industrial environment. A fan requires an air inlet and outlet, and an air channel around the calibrator block, that will allow air from the surroundings to enter the space around the calibrator block also during the calibration process, which might cause instability in temperature.

Many instability sources and possibilities i.e. scenarios in the measurement process itself may affect the dry block performance. While some solutions have been presented, known techniques have not been resulting into a fully satisfactory situation concerning temperature stability.

SUMMARY OF THE INVENTION

The present invention in its first aspect introduces an arrangement, comprising a dry block (30), for detecting and/or increasing stability of a temperature calibration, wherein the dry block (30) comprises a heating and cooling device (33), where the heating and cooling device (33) comprises heating elements. The arrangement is characterized in that the arrangement further comprises an energy metering integrated circuit configured to measure an applied input power to the heating elements of the heating and cooling device (33), the applied input power originating from mains voltage of the dry block (30), and a controller, where a real-time compensation algorithm is executable, the real-time compensation algorithm using measurement results obtained by the energy metering integrated circuit, the compensation algorithm outputting a control signal to the heating elements requesting less or more power from the heating elements.

In its second aspect, the present invention discloses a method applicable with an arrangement, which arrangement comprises a dry block (30), for detecting and/or increasing stability of a temperature calibration, wherein the method comprises the step of heating and/or cooling the dry block (30) by a heating and cooling device (33) comprising heating elements. The method is characterized in that the method further comprises the steps of:
- measuring an applied input power to the heating elements of the heating and cooling device (33) by an energy metering integrated circuit, the applied input power originating from mains voltage of the dry block (30), and
- executing a real-time compensation algorithm by a controller, where the realtime compensation algorithm is using measurement results obtained by the energy metering integrated circuit, the compensation algorithm outputting a control signal to the heating elements requesting less or more power from the heating elements.

In its third aspect, the present invention discloses a computer program applicable with an arrangement, which arrangement comprises a dry block (30), for detecting and/or increasing stability of a temperature calibration, the computer program comprising program code which is executable in a controller, wherein the computer program is configured to execute the step of heating and/or cooling the dry block (30) by a heating and cooling device (33) comprising heating elements. The computer program is characterized in that the computer program is further configured to execute the steps of:
- measuring an applied input power to the heating elements of the heating and cooling device (33) by an energy metering integrated circuit, the applied input power originating from mains voltage of the dry block (30), and
- executing a real-time compensation algorithm by the controller, where the realtime compensation algorithm is using measurement results obtained by the energy metering integrated circuit, the compensation algorithm outputting a control signal to the heating elements requesting less or more power from the heating elements.

Different embodiments are disclosed in the detailed description.

DETAILED DESCRIPTION OF THE INVENTION

The present invention discloses ways to indicate i.e. detect stability of a temperature calibration performed by a temperature calibrator, and furthermore, ways to improve the stability of the temperature calibrator i.e. the dry block i.e. the calibrator block. In other words, the present invention comprises both aspects of monitoring the stability situation and improving the stability situation.

The dry block can be a high-power high-temperature temperature calibrator unit using resistive heaters for heating and a fan for cooling the dry block. The dry block can also be operating in a lower temperature range, when the heating and cooling can be implemented e.g. by using Peltier elements. The high-temperature dry block's temperature range can reach as high as 660° C.

The stability of the dry block can be improved at least in the following two ways. The first way is to try to compensate for the fluctuations in the mains voltage. The second way is to improve insensitivity of the calibrator block for surrounding air. It is possible to use just either of these two ways for improving the stability of the calibrator block in an embodiment, but in another embodiment both these ways are applied simultaneously for the calibrator block to increase stability.

Tests have indicated that about 75% of the temperature instability in the dry block at high temperatures is caused by normal 0.5% . . . 2% voltage fluctuations in mains voltage. By high temperatures we mean temperatures exceeding +50° C. Furthermore, large voltage steps of 5% or even 10% in the mains voltage would cause the temperature in the dry block to be significantly disturbed and the recovery may take several minutes after such voltage step.

Figure 1A:
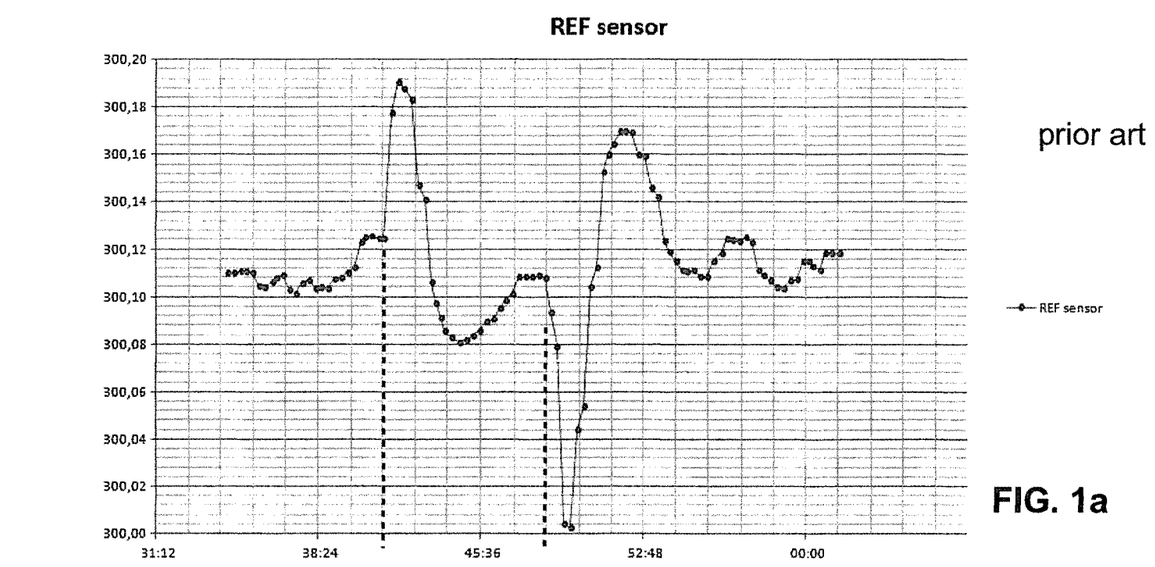
FIG. 1a illustrates measurement results example performed by a reference sensor.
Figure 1B:
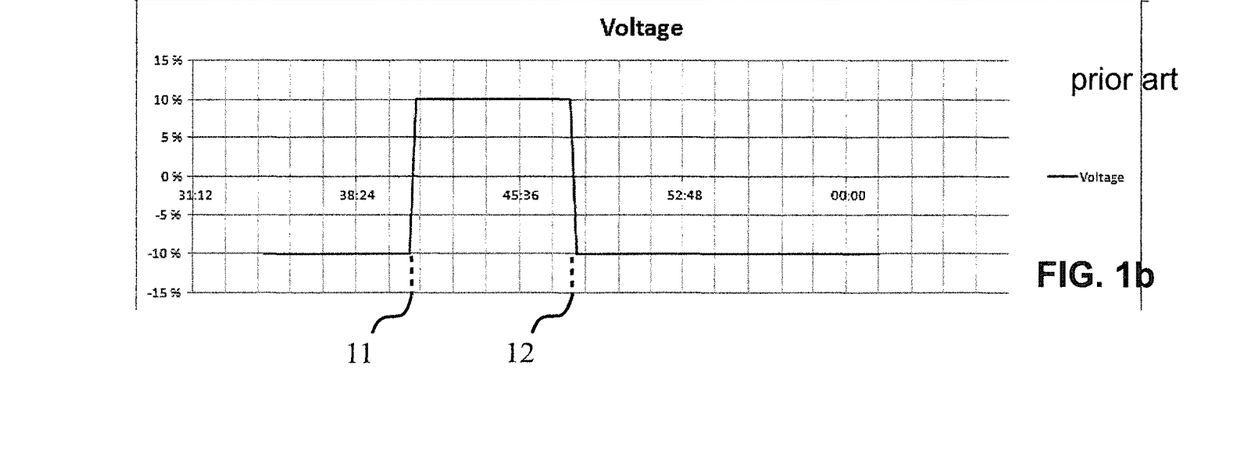
FIG. 1b illustrates an example of a step in a voltage input.

This phenomenon is exemplified in FIGS. 1a and 1b, which illustrate temperature measurement results example performed by a reference sensor in FIG. 1a, and an example of a step in a mains voltage input in FIG. 1b. The moment where there is a rising edge in the mains voltage input is marked as moment 11, and correspondingly, the moment where there is a lowering edge in the mains voltage input is marked as moment 12. From FIG. 1a it can be clearly seen that an increase in the voltage input at moment 11 makes a clear increase to the measured temperature as well before the temperature eventually stabilizes through a slightly oscillative behavior. In a similar fashion, a decrease in the voltage input at moment 12 makes a clear decrease to the measured temperature until the temperature bounces back and stabilizes through an oscillative behavior as well. The voltage step is from −10% to +10% compared to the nominal voltage, and the unit of the temperature in FIG. 1a is degrees in Celsius (° C.).

In other words, FIGS. 1a and 1b show a competitor's dry block that was at 300° C. set-point. As can be seen, the REF sensor in the insert measures about 300.11° C., i.e. there is a fixed difference (error) between REF sensor in the insert and own internal reference of the dry block. It can be deduced that this dry block needs adjustment. However, the main point is that, due to the sudden steps applied to the supply voltage fed into the dry block, the REF sensor temporarily measures a temperature peak and dip of +0.08° C. and −0.11° C. in the dry block insert, which was clearly outside the specification of this dry block. A voltage step of +/−10% is maybe extreme, but a smaller step would just give a slightly smaller temperature change, that still may be outside the specification.

A suggested method in an embodiment is to measure the applied power to the heating elements in real-time, and any measured increase or decrease in the power will cause the software algorithms to either request less or more power from the heaters. This measurement and compensation occur within a much faster feedback loop compared to the normal temperature feedback in the dry block (i.e. where power is decreased if temperature increases, and vice versa).

Energy metering integrated circuits (IC's i.e. metering IC's) are highly integrated parts designed for monitoring energy consumption in various utility metering solutions. In an embodiment of the invention, the system applies such a metering IC, not for monitoring energy consumption but for improving temperature stability in a dry block, where the heating elements are powered by mains voltage.

By using an energy metering IC and applying tailor-made real-time compensation algorithms, instability in the calibrator block is significantly reduced. The dry block is also able to handle large voltage steps with only minor disturbances in the temperature. In other words, the sensitivity of the system for voltage changes from e.g. −10% to +10% of the nominal voltage clearly decreases and the resulting temperature measurement result is much more stable.

Figure 2:
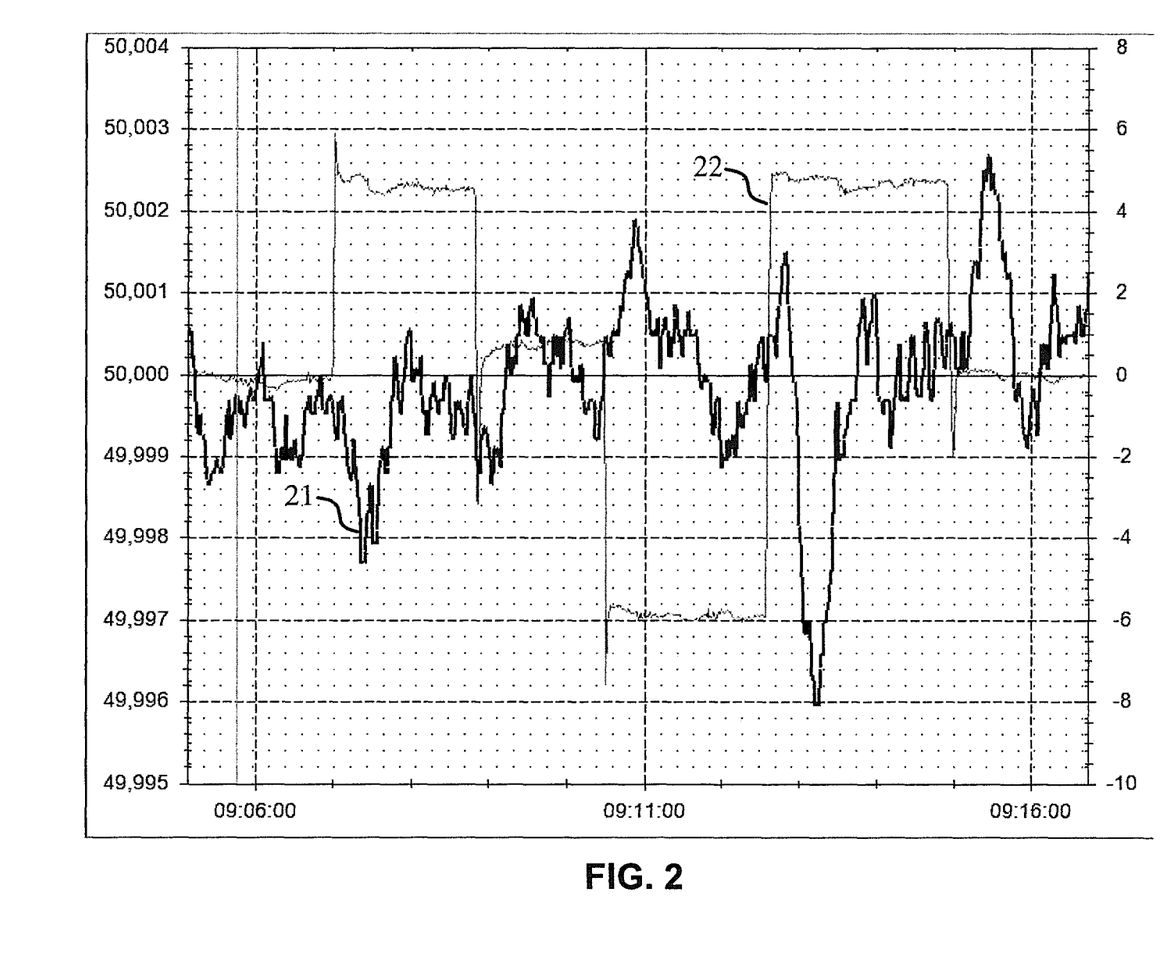
FIG. 2 illustrates measurement results according to the invention.

FIG. 2 illustrates exemplary graphs of such measurement results according to the invention. FIG. 2 is actually an early proof of concept measurement of the dry block according to the present invention. Thick line 21 is dry block's own internal reference sensor measurement in ° C., thin line 22 is voltage step in %. Steps are more realistic and not as large as in FIG. 1b. Anyhow, as can be seen, there are some temperature peaks of +0.003° C. and dips of −0.004° C., but these are not much larger than the normal temperature noise without the voltage steps.

In other words from FIG. 2, and also in more detail, showing with the thin line 22, there is the mains voltage input which comprises step-like changes in the voltage, such as an upper step between times 09:07:00-09:09:00 and between times 09:12:40-09:15:00, and a lower step between times 09:10:30-09:12:40 compared to the nominal voltage present before 09:07:00, between 09:09:00-09:10:30, and after 09:15:00 in the time range shown in this graph. The measured temperature is shown in thick line 21. While it shows some noise-like fluctuations, it can considered as fairly stable and the temperature measurement result changes seem not to be affected from the changes in the mains voltage input. The temperature results all locate here in the range of 50±0.004° C., and mainly between 50±0.002° C., which illustrate a good stability and independence from the mains voltage step-like changes.

According to another aspect of the invention, i.e. in a second way of improving stability, is improving i.e. increasing the insensitivity of the calibrator block for surrounding air. This of course means the same as decreasing the sensitivity of the calibrator block for surrounding air. If there is a sudden airflow around the dry block, part of this moving air can flow into the air channel around the calibrator block and impact the stability of the calibrator block. The air inlet for a fan is typically at the bottom of the device, which requires high feet for the dry block itself to allow free airflow to the air inlet. In some dry blocks, the fan is used also during the calibration process. In this case, if there is an obstacle on one side of the dry block, the radial uniformity of the calibrator block can be impacted. Also, the amount of air flowing in depends on the surface the dry block is standing on, whether it is a solid table or a grid/grill. In order to increase the insensitivity of the calibrator block for the surroundings, following things are suggested in respective embodiments of the invention.

In an embodiment, the dry block i.e. the calibrator block i.e. the calibrator device uses a back draft damper behind the fan, that stops the airflow through the air channels when the fan is off and opens automatically when the fan is started. It is the air pressure from the fan that opens the back draft damper (also called as a flap) and the airflow keeps it open as long as the fan is on. Gravity keeps the flap closed when the fan is off. Because gravity is relied on to keep the flap closed, detecting the possible leaning of the dry block becomes important. The advantage of the above embodiment in general is to prevent the changes in surrounding air (i.e. air flows) from reaching the calibrator block.

In another embodiment, the fan is positioned on the front side of the dry block instead of the bottom. The front side fan has multiple advantages. A first advantage is that the airflow to the fan will always stay free because the calibrator won't be used with the front side towards a wall or towards any other obstacle. A second advantage is that no high legs are needed under the calibrator block, which makes the device more compact (i.e. requiring less physical space). A third advantage is that the incoming airflow is not affected if the calibrator is used on a table or on a grill/grid; therefore, the type of the bottom surface underneath the calibrator is not that critical for the incoming airflow for the fan. A fourth advantage is that if the fan is used during calibration, the radial uniformity in the calibrator block won't be affected if there is an obstacle on one side of the calibrator block.

In an alternative embodiment, the fan may locate at the back side of the dry block. One more advantage of that embodiment would be directing the noise emerging from the fan away from the user of the dry block.

A yet further aspect of the invention is detecting and indicating the stability of the temperature in the temperature calibrator i.e. in the dry block. In the most basic dry blocks, the user is responsible for deciding, when the temperature is stable enough for the calibration to be started. In more advanced dry blocks, the device detects the stability automatically and indicates, when the user can start the calibration. The time required to reach stability should be as short as possible to allow fast calibrations in an industrial environment.

In principle, there are multiple ways to detect stability. Easiest way is to measure difference from temperature setpoint and set a fixed time period for stabilization, once the temperature first reaches the setpoint. However, this method is not very accurate, since the temperature might be oscillating around the setpoint for several minutes before being stable enough. The time might also depend on the number of the sensors to be calibrated and on environmental factors. Another method is basing the stability calculation on the difference between two consecutive measurements. This method is more or less ignoring the nature of temperature as a slowly changing quantity. Even though the difference between any two measurements is small, the temperature might still be crawling towards the setpoint. A bit more advanced method is to have a temperature window around the setpoint, its size being for example two times the promised stability specification. The temperature is then required to be within this temperature window for a fixed time window. The disadvantage of this method is that there might be faulty measurements that are outside the temperature window, which makes the time start over again. The total time to indicated stability might then be unnecessary long.

In an aspect of the present invention, a following method is applied which measures a two times rolling standard deviation over a time window. Once the two times rolling standard deviation is within the promised stability specification, the calibrator device i.e. the dry block is interpreted to be stable. Statistically this means that 95% of the measured values fulfil the specification. This method ignores individual faulty measurements. It also ensures that the possible oscillations are small enough to not disturb the accuracy of the calibration. The time window could be for example 3 minutes, in an embodiment. Once the standard deviation has been small enough for this time period, it is not expected to increase again unless there are big external disturbances.

In yet another embodiment, the system is using orientation of the calibrator as a part of detecting stability. If the calibrator is leaning too much (i.e. not staying in fully upright/vertical position), for example due to standing on an uneven surface, the calibration cannot be accurate. That is why the temperature is not interpreted as stable, if the calibrator is leaning.

In an embodiment, the orientation sensing means is an accelerometer or a group of several accelerometers placed within or on the calibrator.

In an embodiment, one aspect of detecting stability is the place where the stability is measured. The calibrator blocks have at least one sensor as the controlling sensor, which is located inside the calibrator block (called "an internal reference sensor"). If the stability is detected based on the internal reference sensor, the temperature inside the insert might still be changing.

Now discussing in general, another option is to have an external reference sensor located in the removable insert, close to the sensors to be calibrated. If this external reference sensor is used as the controlling sensor, the responses to external disturbances are slower compared to using the internal reference sensor, which degrades stability. Also, the time to stability gets longer when changing setpoint, since the temperature changes in the dry block are always faster compared to the insert. Both of these facts decrease the speed and accuracy of the calibrations.

In yet another aspect of the present invention, the system uses the internal reference sensor for controlling the temperature but the system uses an external reference sensor for indicating stability.

Figure 3:
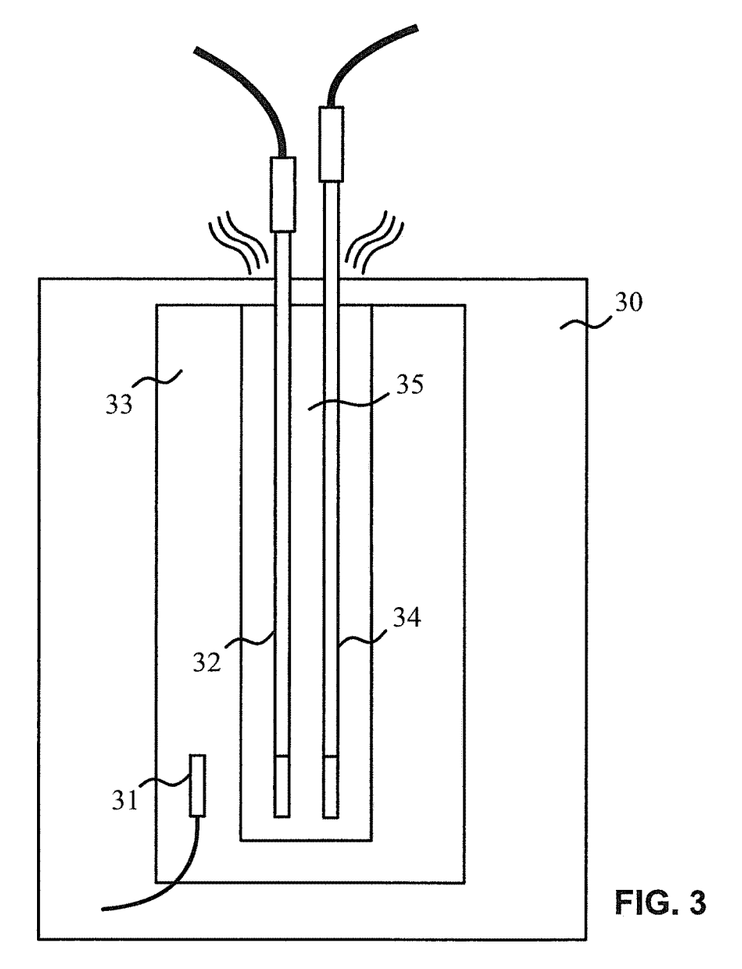
FIG. 3 illustrates an exemplary system configuration of the heating/cooling system.

This aspect is illustrated in an exemplary configuration of FIG. 3 where the heating and cooling system is part of the configuration. A sensor to be calibrated 32 is the longitudinal sensor element in the left hand side. An external reference sensor 34 is the other longitudinal sensor element in the right hand side. The removable insert 35 is an element which is insertable in the calibrator block 30. The sensor to be calibrated 32 and the external reference sensor 34 locate in the removable insert 35. A temperature block 33 (i.e. the heating and cooling device 33) takes care of the heating and cooling, and it locates around or adjacent to the removable insert 35 and thus, the sensors 32, 34 as well. An internal reference sensor 31 locates inside i.e. integrally within the calibrator block 30.

Now in this aspect of the present invention, the configuration uses the internal reference sensor 31 for controlling the temperature via the heating/cooling actions performed by the temperature block 33 (i.e. by the heating and cooling device 33) and additionally, the configuration indicates the temperature stability via the external reference sensor 34. In this way, the above discussed defects are mitigated, and the speed and the accuracy of the calibrations can be increased with the shown configuration principle.

For indicating stability, the easiest way is to give a sound when the device is interpreted to be ready for the start of calibrations. There could also be a symbol or text on the user interface, in another embodiment. In yet another embodiment, the opposite is possible, where the user interface hides the "unstable" symbol or text when it becomes stable. In other words, the UI is then configured to remove a warning text, when the device becomes stable. In an illustrative embodiment of the invention, the system (or the device) constantly may show the measured stability value and the target stability value in a graphical format. This has the advantage of being very practical for the user because of the visual and continuous representation of the stability parameter. However, the measured and target stability values could be shown both numerically and graphically, or with just either of these ways. Always showing both the measured stability value and the target stability value together is not necessary, however. The measured stability value by itself, especially in graphical form, gives in many cases a good enough visual feedback to the user. Thus, in other words and to be more precise, the arrangement may further comprise a user interface configured to show constantly the measured temperature stability value and/or a target temperature stability value in a graphical format and/or in a numerical format, in an embodiment of the present invention.

Figure 4:
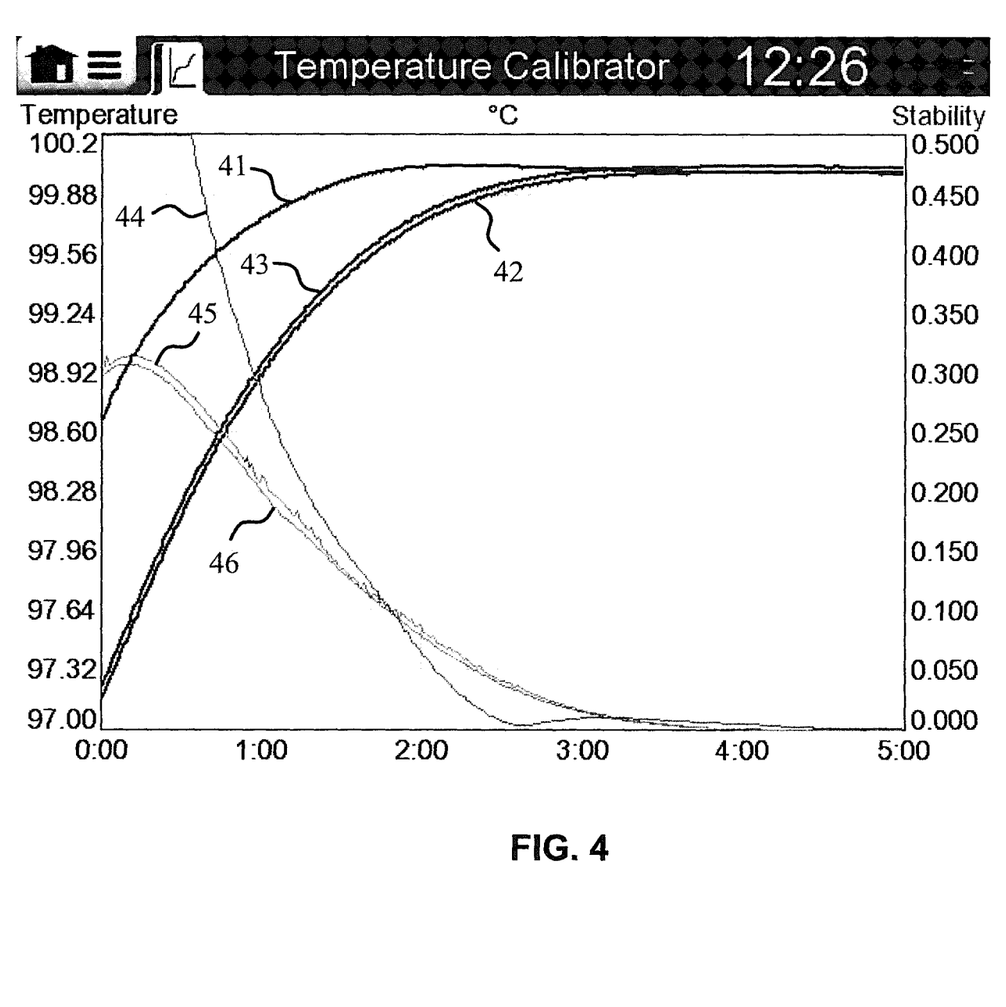
FIG. 4 illustrates the results showing temperature settling within the temperature calibrator, and its stability.

An example of the measurements performed by the temperature calibrator is shown in FIG. 4. The thick first line i.e. first curve 41 means dry block's own internal reference sensor. The thick second line i.e. second curve 42 means the reference sensor in the insert. The thick third line i.e. third curve 43 means the sensor under test in the insert. Thin lines i.e. three thin curves 44, 45, 46 are the momentary 2×STD-DEV calculation (i.e. standard deviation) over the previous 2 minutes (a rolling time window) corresponding to the above measurements (thin first curve 44 corresponds to thick first curve 41, thin second curve 45 corresponds to thick second curve 42, and thin third curve 46 corresponds to thick third curve 43).

There are three different measurement instances showing the settling of the temperature measurements; here around the exemplary value of 100° C. Furthermore, the stability parameter is also shown; closing down near to zero as a function of passing time. It can be seen that in this particular example, at around time instant 4:00, the temperature stability reaches a good value where the actual calibrations could well be started.

In an embodiment of the invention, the arrangement according to the present invention and the dry block 30 are connectable with an external calibrator device. The external calibrator device may be connected to the cables shown in the top of FIG. 3. In this way, the temperature sensor 32 can be calibrated by a separate calibrator (any calibrator in the market capable of temperature measurements). The separate calibrator may proceed with the measurements after the setup has been made, and store the results in the calibrator memory itself, or to a cloud service, for instance. The external calibrator may thus check the quality of the sensor to be calibrated 32 in a predetermined number of temperature checkpoints, by e.g. heating the sensor from the lowest checkpoint to the highest checkpoint by the temperature block 33 (=heating and cooling device), and saving the results after stabilization has been reached for each checkpoint. Finally, the external calibrator may give a verdict, such as "Passed" or "Failed", on the calibrated sensor 32, based on whether the temperature measurement results stay within the predetermined threshold limits. The threshold limits may be defined in the specification sheet of the calibrated sensor 32.

A processor or a controller can be used in executing software-based compensation algorithms. A memory can be applied for storing the relevant computer program(s). All the measurement and/or calibration steps can be applied by executing them via at least one computer program run in the processor. The executed steps may correspond with the above discussed method steps to the extent where such steps are executable in the processor (e.g. calculation, storing, outputting and sending steps, which are just listed as examples in this regard).

Thus, the present invention is discussed through three different aspects, namely an arrangement, a method and a computer program (and a computer program product), all for detecting and/or increasing stability of a temperature calibration.

The present invention is not restricted merely to embodiments presented above, but the present invention may vary within the scope of the claims.

The invention claimed is:

1. An arrangement, comprising a dry block, for detecting and/or increasing stability of a temperature calibration, wherein
the dry block comprises a heating and cooling device, where the heating and cooling device comprises heating elements, wherein the arrangement further comprises:
a power metering integrated circuit configured to measure an applied input power to the heating elements of the heating and cooling device, the applied input power originating from mains voltage of the dry block,
a controller, where a real-time compensation algorithm is executable, the real-time compensation algorithm outputting a control signal to the heating elements requesting less or more power from the heating elements based at least in part on the applied input power measured by the power metering integrated circuit,
an orientation sensor configured to detect, whether the dry block is not staying in a fully upright position, and
the controller configured to decide the dry block as unstable if the dry block is leaning.

2. The arrangement according to claim 1, wherein the arrangement further comprises a fan of the heating and cooling device, wherein the fan is configured to be positioned on the front side of the dry block.

3. The arrangement according to claim 1, wherein the arrangement further comprises a fan of the heating and cooling device, wherein the fan is configured to be positioned on the back side of the dry block.

4. The arrangement according to claim 1, wherein the arrangement further comprises the controller, in which instructions are executable, the instructions comprising
measuring a two times rolling standard deviation over a time window, and when the two times rolling standard deviation is within a promised stability specification, interpreting the dry block to be stable.

5. The arrangement according to claim 4, wherein the predetermined time window is three minutes.

6. The arrangement according to claim 1, wherein the arrangement further comprises:

an insert comprising an external reference temperature sensor and a temperature sensor to be calibrated, the insert locating adjacent to the heating and cooling device, an internal reference temperature sensor in the dry block adjacent or in the vicinity of the heating and cooling device, wherein the arrangement is configured to use the internal reference temperature sensor for controlling the temperature of the dry block via the heating and cooling device, and the arrangement is configured to use the external reference temperature sensor for indicating temperature stability of the dry block.

7. The arrangement according to claim 6, wherein the arrangement further comprises a beeper configured to output a sound, when the dry block is interpreted to be temperature-stable and ready for the start of calibrations.

8. The arrangement according to claim 6, wherein the arrangement further comprises a user interface configured to show a symbol or text, or configured to remove a warning text, when the dry block is interpreted to be temperature-stable and ready for the start of calibrations.

9. The arrangement according to claim 6, wherein the arrangement further comprises a user interface configured to show constantly the measured temperature stability value and/or a target temperature stability value in a graphical format and/or in a numerical format.

10. A method applicable with an arrangement, which arrangement comprises a dry block, for detecting and/or increasing stability of a temperature calibration, wherein the method comprises the step of:

heating and/or cooling the dry block by a heating and cooling device comprising heating elements, wherein the method further comprises the steps of:

measuring an applied input power to the heating elements of the heating and cooling device by a power metering integrated circuit, the applied input power originating from mains voltage of the dry block, executing a real-time compensation algorithm by a controller, the real-time compensation algorithm outputting a control signal to the heating elements requesting less or more power from the heating elements based at least in part on the applied input power measured by the power metering integrated circuit, sensing orientation of the dry block by an orientation sensor in order to detect, whether the dry block is not staying in a fully upright position, and deciding the dry block as unstable by the controller if the dry block is leaning.

11. The method according to claim 10, wherein the method further comprises the step of:

measuring a two times rolling standard deviation over a time window, and when the two times rolling standard deviation is within a promised stability specification, interpreting the dry block to be stable.

12. The method according to claim 10, wherein the arrangement comprises:

an insert comprising an external reference temperature sensor and a temperature sensor to be calibrated, the insert locating adjacent to the heating and cooling device, and an internal reference temperature sensor in the dry block adjacent or in the vicinity of the heating and cooling device, wherein the method further comprises the steps of:

using the internal reference temperature sensor for controlling the temperature of the dry block via the heating and cooling device, and using the external reference temperature sensor for indicating temperature stability of the dry block.

13. A non-transitory computer readable medium applicable with an arrangement, which arrangement comprises a dry block, for detecting and/or increasing stability of a temperature calibration, the computer readable medium comprising program instructions that, when executed by a processor of a computing device, cause the computing device to execute the steps of:

heating and/or cooling the dry block by a heating and cooling device comprising heating elements, wherein the processor is further configured to execute the steps of:

measuring an applied input power to the heating elements of the heating and cooling device by a power metering integrated circuit, the applied input power originating from mains voltage of the dry block, executing a real-time compensation algorithm by the controller, the real-time compensation algorithm outputting a control signal to the heating elements requesting less or more power from the heating elements based at least in part on the applied input power measured by the power metering integrated circuit, sensing orientation of the dry block by an orientation sensor in order to detect, whether the dry block is not staying in a fully upright position, and deciding the dry block as unstable by the controller if the dry block is leaning.

* * * * *